United States Patent
Heredia et al.

(10) Patent No.: US 6,539,210 B1
(45) Date of Patent: Mar. 25, 2003

(54) AUTOMATIC ASSIGNMENT AND TUNING OF RADIO CALL LETTERS TO RADIO PRESETS

(75) Inventors: Rafael Heredia, Easley, SC (US); Sean S. Priddy, Simpsonville, SC (US)

(73) Assignee: Openglobe, Inc., Indianapolis, IN (US)

( * ) Notice: Subject to any disclaimer, the term of this patent is extended or adjusted under 35 U.S.C. 154(b) by 0 days.

(21) Appl. No.: 09/689,725

(22) Filed: Oct. 13, 2000

Related U.S. Application Data

(60) Provisional application No. 60/159,102, filed on Oct. 13, 1999.

(51) Int. Cl.⁷ ................................................. H04B 1/08
(52) U.S. Cl. ............................... 455/154.1; 455/186.1; 455/552; 455/556; 709/217
(58) Field of Search ............................ 455/3.01, 3.06, 455/154.1, 158.4, 158.5, 186.1, 45, 552, 553, 556, 557, 8; 348/10, 734; 707/10, 104; 709/217, 218, 219

(56) References Cited

U.S. PATENT DOCUMENTS

| | | |
|---|---|---|
| 5,307,173 A | 4/1994 | Yuen et al. |
| 5,335,079 A | 8/1994 | Yuen et al. |
| 5,346,326 A | 9/1994 | Bienvenu |
| 5,353,121 A | 10/1994 | Young et al. |
| 5,479,268 A | 12/1995 | Young et al. |
| 5,488,409 A | 1/1996 | Yuen et al. |
| 5,515,173 A | 5/1996 | Mankovitz et al. |
| 5,523,796 A | 6/1996 | Marshall et al. |
| 5,532,732 A | 7/1996 | Yuen et al. |
| 5,532,754 A | 7/1996 | Young et al. |
| 5,539,391 A | 7/1996 | Yuen |
| 5,541,738 A | 7/1996 | Mankovitz |
| 5,550,576 A | 8/1996 | Klosterman |
| 5,552,837 A | 9/1996 | Mankovitz |
| 5,553,123 A | 9/1996 | Chan et al. |
| 5,559,550 A | 9/1996 | Mankovitz |
| 5,619,274 A | 4/1997 | Roop et al. |
| 5,619,383 A | 4/1997 | Ngai |
| 5,673,089 A | 9/1997 | Yuen et al. |
| 5,684,525 A | 11/1997 | Klosterman |
| 5,694,334 A | 12/1997 | Donahue et al. |
| 5,701,383 A | 12/1997 | Russo et al. |
| 5,710,601 A | 1/1998 | Marshall et al. |
| 5,727,060 A | 3/1998 | Young |
| 5,732,338 A | 3/1998 | Schwob |
| 5,790,198 A | 8/1998 | Roop et al. |
| 5,801,787 A | 9/1998 | Schein et al. |
| 5,808,608 A | 9/1998 | Young et al. |

(List continued on next page.)

FOREIGN PATENT DOCUMENTS

WO 99/38266 7/1999

OTHER PUBLICATIONS

DVX 8000 manual, Philips Electronics North America Corporation, 1997.

Primary Examiner—Lester G. Kincaid

(57) ABSTRACT

Broadcast signals are detected and matched with signal information, such as call letters, genre and geographical location for corresponding signal sources, based on the geographical location of the receiver and the frequency at which the signals are broadcast. The signal information is stored with signal and medium selection data, so that signal sources provided via different communication media, such as broadcast radio and Internet streaming audio, can be accessed, sorted, selected and displayed together. Thus, a user can group for display information about signal sources transmitting a type of music that the user enjoys, via any communication medium that the receiver supports. Also, a currently selected signal source and communication medium can be matched with a different communication medium for the same source, so that if the received signal deteriorates, the receiver can switch to the different communication medium for receipt of the same signal.

44 Claims, 10 Drawing Sheets

U.S. PATENT DOCUMENTS

| | | | |
|---|---|---|---|
| 5,809,204 A | | 9/1998 | Young et al. |
| 5,828,945 A | | 10/1998 | Klosterman |
| 5,852,478 A | | 12/1998 | Kwoh |
| 5,870,150 A | | 2/1999 | Yuen |
| 5,886,746 A | | 3/1999 | Yuen et al. |
| 5,892,536 A | * | 4/1999 | Logan et al. .................. 348/13 |
| 5,898,910 A | | 4/1999 | Miyake et al. |
| 5,905,865 A | * | 5/1999 | Palmer et al. ................ 455/3.1 |
| 5,907,322 A | * | 5/1999 | Kelly et al. .................. 455/6.2 |
| 5,915,026 A | | 6/1999 | Mankovitz |
| 5,923,362 A | | 7/1999 | Klosterman |
| 5,940,073 A | | 8/1999 | Klosterman et al. |
| 5,949,954 A | | 9/1999 | Young et al. |
| 5,959,688 A | | 9/1999 | Schein et al. |
| 5,969,748 A | | 10/1999 | Casement et al. |
| 5,970,206 A | | 10/1999 | Yuen et al. |
| 5,974,222 A | | 10/1999 | Yuen et al. |
| 6,018,522 A | * | 1/2000 | Schultz ....................... 455/5.1 |
| 6,286,063 B1 | * | 9/2001 | Bolleman et al. ............ 709/217 |
| 6,317,784 B1 | * | 11/2001 | Mackintosh et al. ........ 709/219 |

* cited by examiner

FIG. 3A

| CALL LETTERS | CITY | STATE | COUNTRY | FREQUENCY | LATITUDE | LONGITUDE |
|---|---|---|---|---|---|---|
| KSTE | RANCHO CORDOVA | CA | US | 650 | 38.47944 | 121.2761 |
| KHNR | HONOLULU | HI | US | 650 | 21.44528 | 158.0636 |
| WRPT | AHSLAND | MA | US | 650 | 42.28806 | 71.43139 |
| WNMT | NASHWAUK | MN | US | 650 | 47.37528 | 93.01556 |
| WSM | NASHVILLE | TN | US | 650 | 35.99722 | 86.79222 |

FIG. 3B

| CALL LETTERS | CITY | STATE | COUNTRY | FREQUENCY | LATITUDE | LONGITUDE |
|---|---|---|---|---|---|---|
| KJFP | YAKUTAT | AK | US | 103.9 | 59.55556 | 139.7422 |
| KKRO | ANCHORAGE | AK | US | 102.1 | 61.16611 | 149.8261 |
| KFAT | ANCHORAGE | AK | US | 92.9 | 61.33611 | 149.5131 |
| KNIKFM | ANCHORAGE | AK | US | 105.3 | 61.1925 | 149.9003 |
| KTOO | JUNEAU | AK | US | 104.3 | 58.30111 | 134.4225 |

FIG. 3C

| ZIP CODE | STATE | CITY | LONGITUDE | LATITUDE |
|---|---|---|---|---|
| 35004 | AL | ACMAR | 86.51557 | 33.58413 |
| 35005 | AL | ADAMSVILLE | 86.95973 | 33.58844 |
| 35006 | AL | ADGER | 87.16746 | 33.43428 |
| 35007 | AL | KEYSTONE | 86.81286 | 33.23687 |
| 35010 | AL | NEW SITE | 85.95109 | 32.94145 |

FIG. 4A

| CALL LETTERS | FREQ. | BAND | GENRE |
|---|---|---|---|
| WAUD | 1230 | AM | ADULT ALTERNATIVE |
| KZAT | 95.5 | FM | ADULT ALTERNATIVE |
| WTOH | 105.9 | FM | ADULT ALTERNATIVE |
| WVUA | 90.7 | FM | ADULT ALTERNATIVE |

FIG. 4B

| CALL LETTERS | NAME | GENRE | URL (PREPEND "HTTP://") | CITY | STATE | COUNTRY |
|---|---|---|---|---|---|---|
| AUST | AUSTRALIA | POP | WWW.WRN.ORG/AUDIO/0800_USA.RAM | PERTH | | AUSTRALIA |
| 2FM | IRELAND | POP | EVENTS.RTE.IE/2FM.RAM | DUBLIN | | IRELAND |
| RFNO | NEW ORLEANS | JAZZ | WWW.NEWORLEANSONLINE.COM/RFNO.RAM | NEW ORLEANS | LA | USA |
| RSSA | RUSSIA | POP | WWW.WRN.ORG/ADUIO/VOR_ENG_USAS.RAM | MOSCOW | | RUSSIA |

RadioXXL-The Best Alternative/Modern Rock

Genre: Rock
Location: San Padre Island

Song: Everybody's Free to
Wear Sunscreen

COVER ART
or
RADIO
AD SPACE

No Doubt streaming 128kpbs

OpenGlobe Internet Radio

AUTOMATIC ASSIGNMENT AND TUNING OF RADIO CALL LETTERS TO RADIO PRESETS

CROSS-REFERENCE TO RELATED APPLICATION

This application is related to U.S. patent application Ser. No. 09/453,023, filed Dec. 2, 1999 by Rafael Heredia, et al., incorporated herein by reference and U.S. Patent Application Ser. No. 60/159,102, filed Oct. 13, 1999, entitled AUTOMATIC ASSIGNMENT AND TUNING OF RADIO CALL LETTERS TO RADIO PRESETS.

BACKGROUND OF THE INVENTION

1. Field of the Invention

The present invention is directed to identifying signals from multiple sources and, more particularly, to identifying broadcast radio signals and radio signals received via a packet-based network.

2. Description of the Related Art

The amount of information displayed while audio signals are produced by many devices has changed dramatically in recent years and further changes have been proposed. For decades, radios only provided an indication of the band selected and an approximation of the frequency to which the radio was tuned. Similarly a user was limited to estimating the track and viewing a rotating label of a phonograph as it was played. Now, digital displays on tuners provide a more precise indication of frequency and some permit a user to manually enter call letters for stations. For recorded music, CD players indicate the track and often the number of minutes and seconds the track has been played.

In addition, personal computers are now used as audio and video output devices from locally stored media, such as compact discs (CDs), or Motion Pictures Experts Group (MPEG) files stored in mass memory. There are also databases available, e.g., via packet-based networks, such as the global network commonly referred to as the Internet, containing information on titles, tracks, and artists of CDs, as well as sources for streaming audio or downloadable audio files. Sources for streaming audio available via the Internet include radio stations that also broadcast signals from antenna to antenna and "Internet-only" stations that have programming of a particular format or genre. Databases that identify streaming audio also often include location, language of any spoken audio, network address, speed of delivery, call letters, frequency, slogan, logo, and genre or format. Computer software, commonly termed "player software," that outputs the signal received from such network addresses via streaming audio often displays information about an audio selection currently being received, including information identifying the source, name of the artist(s) that produced the music or other audio, and album and track titles, if the audio is from a recording with multiple tracks, such as a CD. The player software for streaming audio received via the Internet often permits storage of addresses in a local or personal database, to simplify subsequent selection of sources. Such databases are often identified as "presets" in the user interface of the player software.

Also, there are several different broadcast systems using digital audio signals that are broadcast from antenna to antennas or via cable, such as the audioonly channels provided by digital cable and satellite television systems, and include signal information in text that is embedded in the digital stream along with the audio signal. This is very similar to the way that the player software for streaming audio receives the information that is displayed by the computer display. When the equipment used to receive a broadcast signal containing embedded textual information is not a personal computer, information similar to that described above for player software may be displayed selectively, on a scrolling screen, or in some other manner.

Examples of embedded information in broadcast signals include those used by WebTV™ for hyperlinks associated with a program as it is broadcast and by Gemstar International Group Limited for program guide information which is best known for use by VCR Plus+®. Both of these services use the vertical blanking interval (VBI) in analog television signals. However, some broadcasters remove the embedded signals and the association is primarily with the content of the program being broadcast.

In addition to stand-alone receivers for signals received from a broadcast antenna, or its cable equivalent, peripheral devices are available for computers to receive broadcast audio (and video) signals. Depending on the software used and the signal supplied by the source, the computer display may include signal information, such as call letters and frequency, as well as album and track titles. However, no known device integrates signals received from a broadcast antenna, or its cable equivalent, with signals received via a packet-based network or that can automatically obtain information about a broadcast signal that does not have textual information embedded in the signal, as some digital broadcasts do.

SUMMARY OF THE INVENTION

It is an object of the present invention to automatically identify broadcast signals.

It is another object of the present invention to display information about a broadcast signal received via an antenna.

It is a further object of the present invention to display information about signals that can be received via both broadcast and a packet-based network.

It is yet another object of the present invention to automatically switch between a radio signal receivable via both antenna and a packet-based network.

It is a still further object of the present invention to obtain data on listener habits from radio preset selections.

The above objects can be attained by a method of identifying signal sources, including obtaining a signal from a signal source via a communication medium; and accessing at least one database from a data source separate from the signal source to obtain signal information about the signal source.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 3A–3C are samples of databases generated from data available from government databases.

FIGS. 4A and 4B are samples of databases generated by the present invention.

DESCRIPTION OF THE PREFERRED EMBODIMENTS

Figure 1:
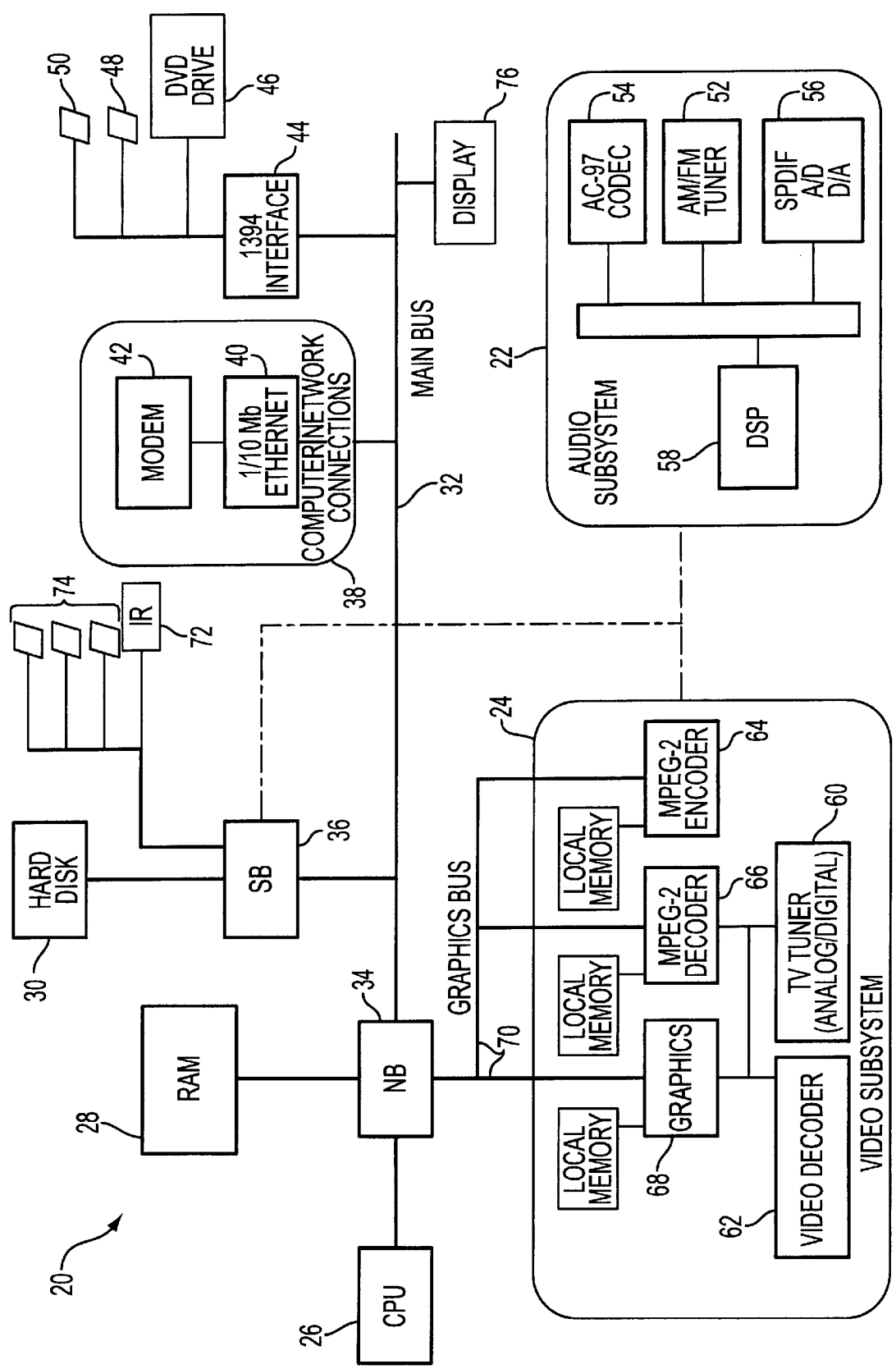
FIG. 1 is a block diagram of a system to which the present invention can be applied.

Illustrated in FIG. 1 is a block diagram of a system 20 to which the present invention can be applied. None of the hardware specified below is required to practice the present invention. The minimum requirement is a broadcast signal receiver controlled by a processor with both program and data storage. Thus, the minimum requirements could be met by adding the program and, if necessary, data storage to existing AM/FM receivers or any of the proposed devices for receiving digital radio broadcasts, and also might be applied to other broadcast signals, such as television. In the preferred embodiment, the receiver includes a connection to a packet-based network for receiving both data and signals via a packet-based network, such as what is commonly termed the Internet.

The system 20 has an overall construction of a computer with audio 22 and video 24 subsystems. The usual computer components of a processor (CPU) 26, RAM 28 and a storage unit 30, such as a hard disk, are connected by main bus 32. In FIG. 1, the common IBM personal computer northbridge 34 and southbridge 36 structures are also illustrated, but the present invention is not limited to this computer architecture. In addition, computer network connections 38 are provided, such as a local area network connection 40 and modem 42. A high speed device interface 44, such as IEEE-1394, is also connected to main bus 32, to provide a connection to components such as removable disc drive 46 for reading digital versatile discs, compact discs, etc., and additional external devices at ports 48, 50.

The components major components of the audio subsystem 22 illustrated in FIG. 1 include AM/FM tuner 52 and a programmable analog mixer 54, such as an AC97 codec available for many chip manufacturers; one example is Crystal Semiconductor CS4297A. Also illustrated in FIG. 1 are decoders 56 of several types including Sony-Philips digital interface (S/PDIF), analog/digital converters and digital/analog converters, as described in more detail below. Digital signal processor 58 performs processing of audio signals, e.g., to provide surround sound effects such as hall, stadium, club, church, etc., and outputs the audio signals to speakers via amplifiers (not shown). Also supported are Digital Dolby, DTS and variable echo, reverberation, loudness, speed and direction. An example of a DSP chip that can be used is a Crystal Semiconductor CS 4296

In video subsystem 24, television tuner 60 may be provided by a Philips Semiconductor module F1236 MK2-PH or similar device. Video decoder 62 may be provided by components such as one or more Video Matrix TEA6425 chips for decoding S-video inputs and a peripheral device coupled to main bus 32, such as an ATI Rage® Theater™ graphics chip or similar graphics component. Encoder 64 and decoder 66 for Motion Picture Experts Group (MPEG-2 or ISO 13818) compressed digital video, and graphics module 68 may be provided by, e.g., an ATI Rage® 128 AGP card coupled to graphics bus 70.

Southbridge 36 provides connection to other peripheral devices through the universal serial bus (USB) ports to devices, such as an infrared output 72, e.g., a JDS IR-XP$^2$, for controlling devices connected to apparatus 20. Other ports 74 are provided for devices having other control inputs, such as RS-232, Sony's S-link, a keypad or keyboard, etc. Additional conventional television components such as a comb filter (e.g., a Philips TDA9183T or similar chip for S-video components) may be included in video subsystem 24.

Display 76 may be a liquid crystal display (LCD) for providing information such as radio frequency, call letters, etc. However, much of the display information used to interact with the user is preferably output to a television monitor or similar device connected to video subsystem 24.

Figure 2:
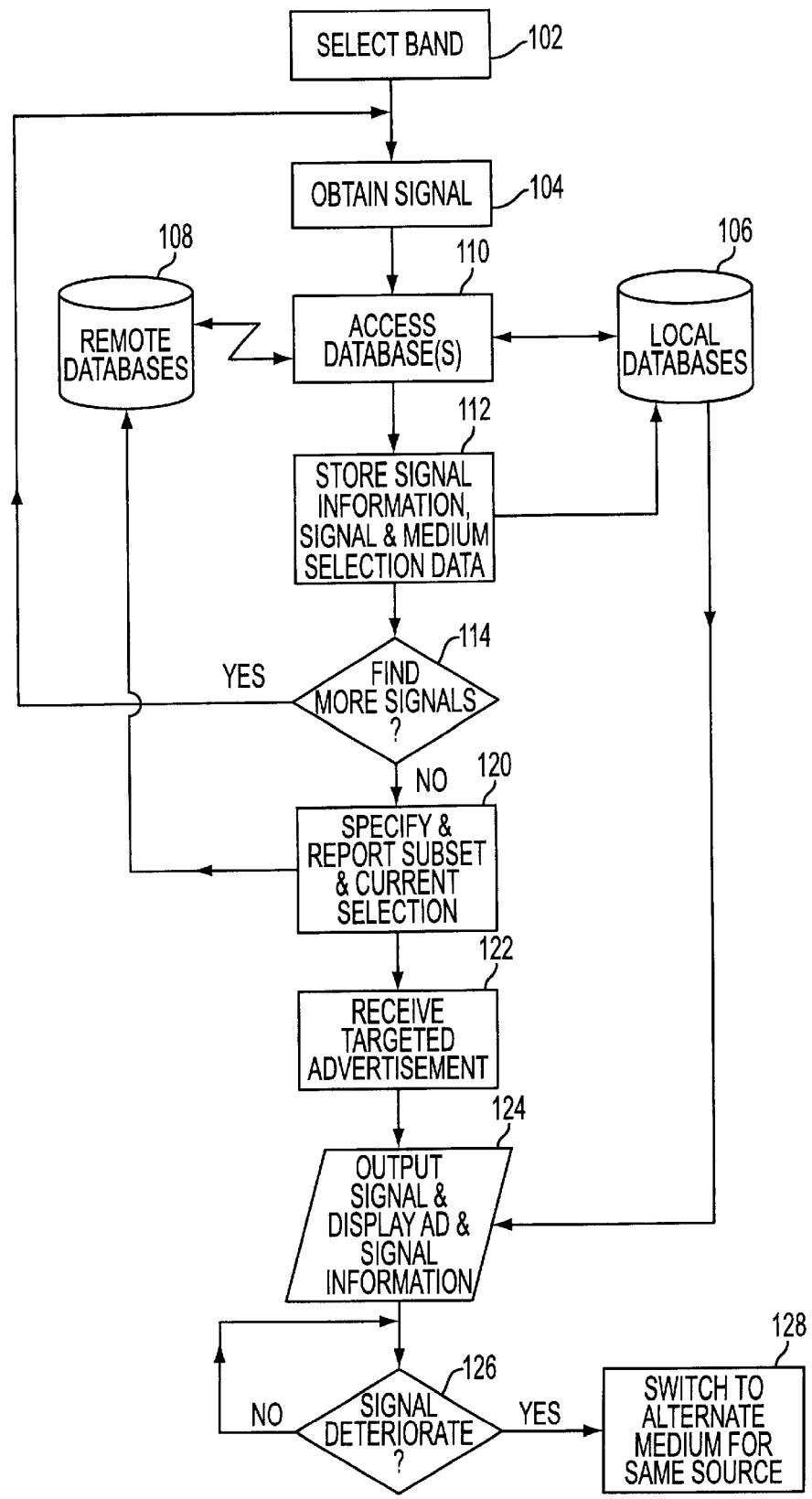
FIG. 2 is a flowchart of a method of identifying signal sources according to the present invention.

FIG. 2 is a flowchart of a method according to the present invention that can be implemented using the apparatus illustrated in FIG. 1. In the following description, it will be assumed that the signal being received is an audio signal from AM/FM tuner 52 or via one of the computer network connections 38 for a signal from the Internet. However, the present invention can also be applied to video signals received by TV tuner 60 or computer network connections 38. Also, many of the steps can be performed either manually or automatically, as indicated in the following description.

Since the apparatus illustrated in FIG. 1 can be used to receive signals from many different sources, initially a communication medium is selected 102. For example, the AM or FM band of frequencies is selected if a listener wants to hear a broadcast radio program. Next, the apparatus obtains 104 a signal by adjusting the tuning of AM/FM tuner 52 or addressing a location on the computer network that supplies an audio signal. In the case of a conventional analog radio broadcast, the signal obtained in step 104 will contain only an audio signal. However, it is possible to determine the source of the signal and obtain additional information, from the frequency and the location of the receiver. Currently existing databases are available via the Internet for obtaining such information in the United States of America and similar databases may be available, or could be created for other countries.

The U.S. Federal Communication Commission (FCC) makes databases available that contain the longitude and latitude of all antennas broadcasting in the 535 kHz to 1705 kHz and 88 MHZ to 108 MHz bands, and the frequencies, call letters and locations by city and state for each of the stations using those antennas. Samples of the relevant portions of the records in the FCC databases for AM and FM radio stations and their antenna locations are illustrated in FIGS. 3A and 3B, respectively. In addition, the Census Bureau has a database available that provides an approximate longitude and latitude for most zip codes in the United States of America. A sample of the relevant portion of the records in the Census Bureau database is illustrated in FIG. 3C. Using the frequency to which AM/FM tuner 52 is tuned and the zip code at its location, system 20 is able to determine all AM and FM radio stations within, e.g., 100 miles or 160 kilometers.

The information from the U.S. government databases can be either pre-loaded and stored in local databases 106, or downloaded from remote databases 108, e.g., at the time that system 20 illustrated in FIG. 1 is initially connected, or accessed as needed. Remote databases 108 can be either the U.S. government databases accessed directly, or processed directories accessed from a service that has already extracted the information required by system 20. If a service is not used, the software in system 20 must include the extraction routines. In the preferred embodiment, remote databases 108 are provided by a service that has already extracted and formatted the data required by the present invention and maintains other databases, as discussed below.

System 20 accesses 110 either the local databases 106 or remote databases 108, or a combination of the two using the broadcast frequency and the zip code for the receiver which is typically provided by the user. In some areas, it may be possible to determine the zip code using the automatic number identification (ANI) supplied when using a dial-up connection to call into the service that provides remote databases 108. Databases could be provided that convert the exchange of a telephone number to one or more zip codes or directly to latitude or longitude In the preferred embodiment, the accessing 110 the databases 106 or 108 obtains all radio station antennas broadcasting signals in the band selected in step 102 that are located in a square whose sides have a predetermined minimum distance to the receiver of, e.g., 100 miles. To obtain the coordinates of latitude and longitude corresponding to such a square, it is assumed that degrees latitude are multiplied by $10^4/145$ to obtain miles and that the number of degrees longitude equal to 100 miles at a latitude of x can be obtained using the formula $$|(1.6093/(111*\cos(x))*100)|.$$

If there is more than one antenna broadcasting a signal at the frequency used to obtain the signal, it is assumed that the closest antenna is broadcasting the signal that is being received, but the user is presented with the opportunity to select one of the other stations if this assumption is incorrect. Alternatively, the area of potential broadcast antennas could have another shape, such as a circle, or a series of increasingly larger areas until an antenna has been found for each of the signals that can be detected with sufficient strength.

Once the source of the signal has been identified, signal information initially obtained from the remote databases 108 is stored 112 together with the signal and medium selection data in local databases 106. If the signal information is pre-stored in the local databases 106, the information can either be flagged, or transferred from the national database to a database of local radio stations. Preferably, the signal information includes the genres or programming format of the signal sources. A sample of databases generated for broadcast radio stations and signal sources available via the Internet, i.e., an "Internet station," are illustrated in FIGS. 4A and 4B, respectively.

Steps 102, 104, 110 and 112 can be performed each time a user selects a new signal to create a set of "presets" for the user. Alternatively, when system 20 is initially activated with a connection to remote databases 108, system 20 can automatically scan through the available bands and frequencies after confirming that antenna(s) have been connected, either by prompting the user or based on the strength of the signals that are obtained in step 104. This process is similar to the one used by some televisions to detect available television stations and will therefore not be described in detail. If the signal information is to be obtained for multiple signal sources, after storing 112 the signal information and signal and medium selection data, it is determined 114 whether there are more signals to be found and steps 104, 110 and 112 are repeated until all signals are found. Although not illustrated in FIG. 2, step 102 is also repeated if the process is to be performed for more than one band.

When the signal information obtained for the signal sources automatically detected by steps 104, 110, 112 and 114 includes genre or program format information, preferably subsets of signal sources are automatically defined by genre. The user is then given the opportunity to select genres for display in a menu. In addition, the user is given the flexibility of combining radio station presets, generated as described above, with similar information from signal sources available via the Internet, e.g., grouping both broadcast and Internet stations by genre. Multiple sets of stations may be stored in hard disk 30 (FIG. 1) corresponding to different users, different genres or any other grouping specified 120 by a user. A display generated for one such grouping is illustrated in FIG. 5.

In one embodiment of the present invention, the user presets are reported 120 to the service that provides remote databases 108. In addition, the currently selected signal source may also be reported. This enables the service represented by remote databases 108, or the signal sources, or other providers of information to supply targeted advertisements that are received 122 by system 20. Information used for determining advertisements to be supplied may include any of the signal information for the currently selected signal source, or a subset of signal sources stored as presets, including genre, or the geographical location of the user, i.e., the receiving location determined from the zip code, or the telephone exchange. Examples of targeted advertisements include related programming, even on a different communication medium, such as a radio personality that also has a television show or a guest on a radio program who is also doing an Internet chat session, informing users about other signal sources that have a similar format or program to the program that is currently being received or that matches a group of preset signal sources selected by the user. Targeted advertisement made possible by the reporting 120 of user listening habits is able to receive higher advertising rates than conventional broadcast advertisements.

Figure 5:
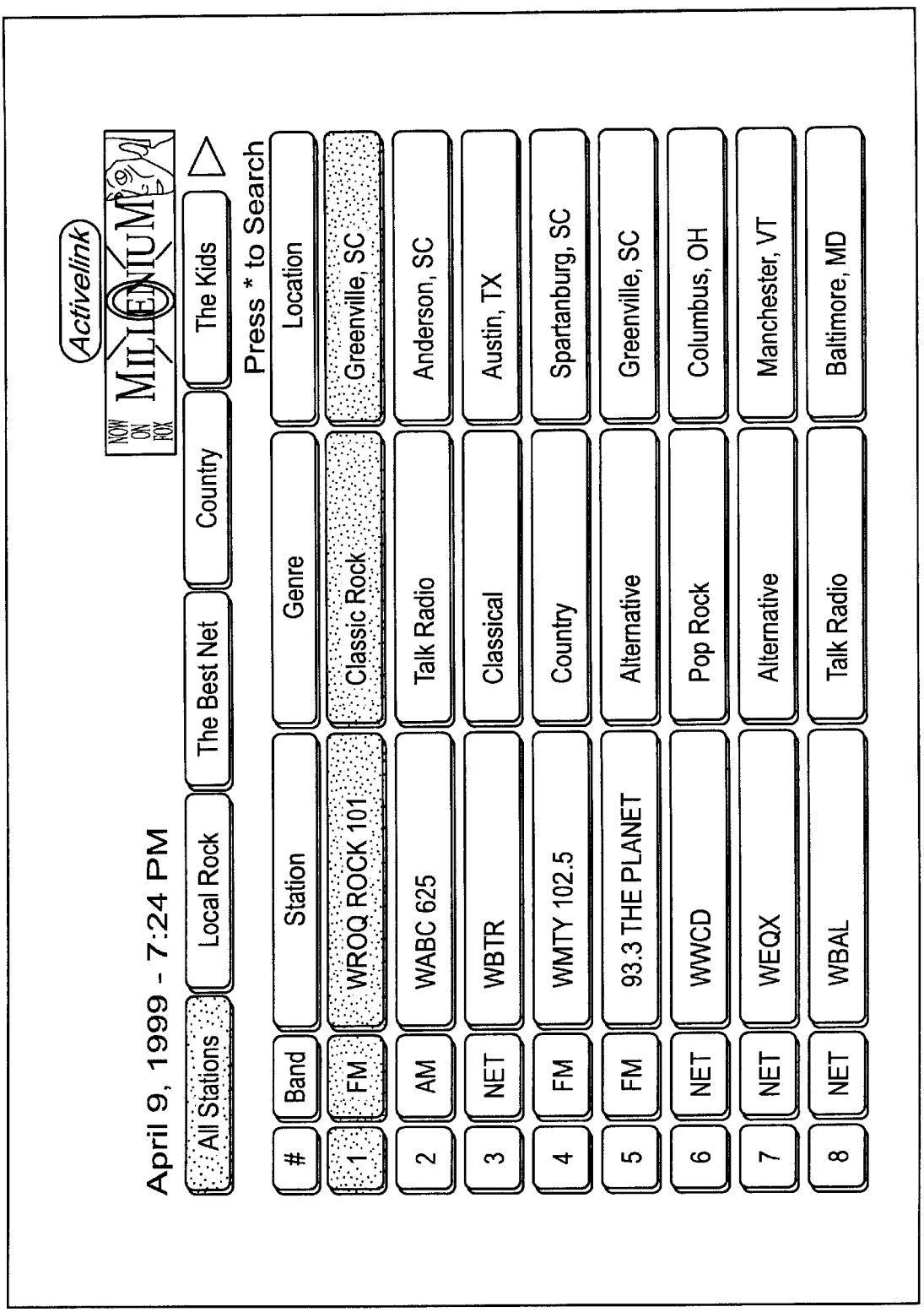
FIGS. 5–9 are examples of displays that can be generated according to the present invention.
Figure 6:
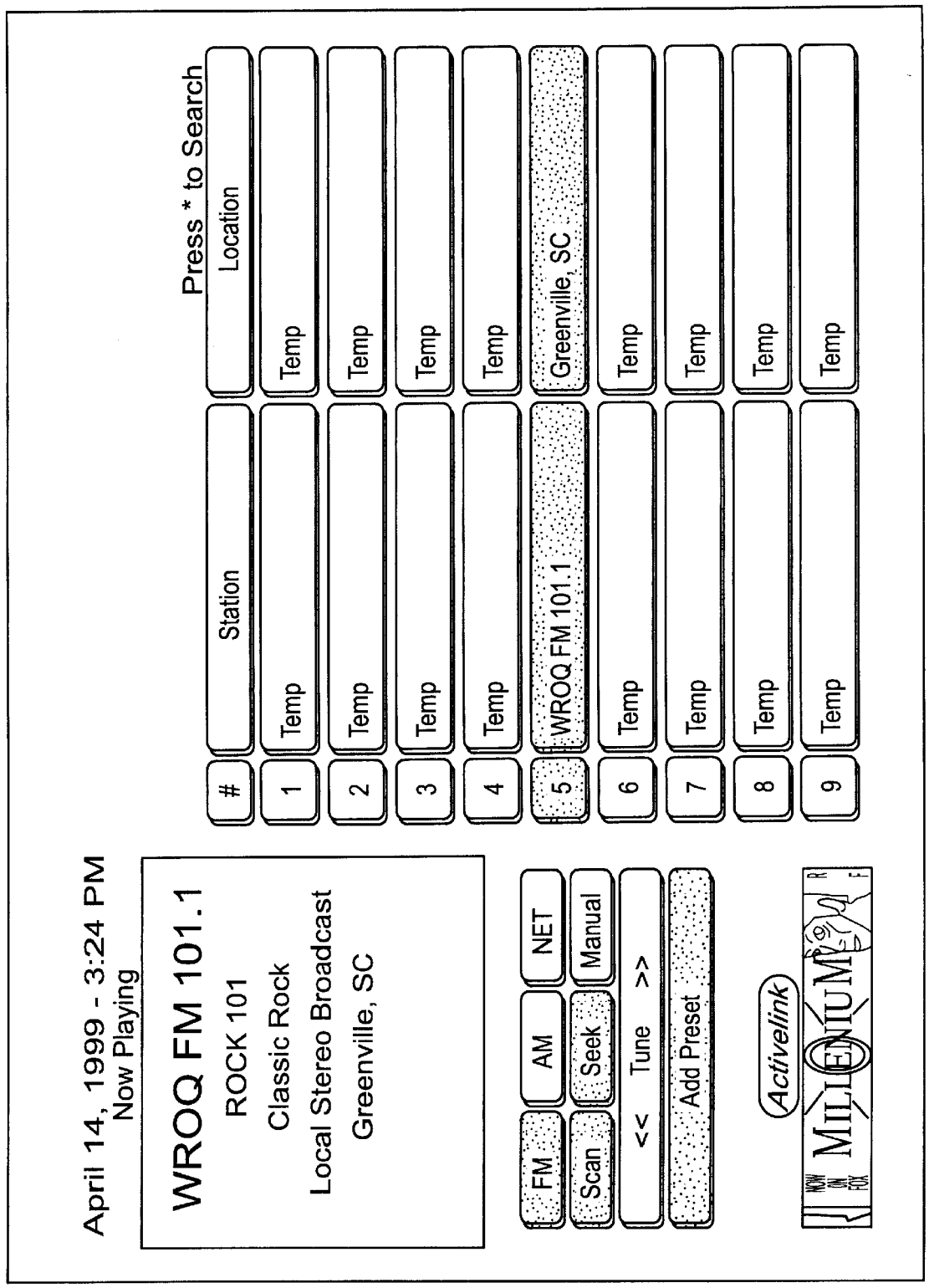
Figure 7:
Figure 8:
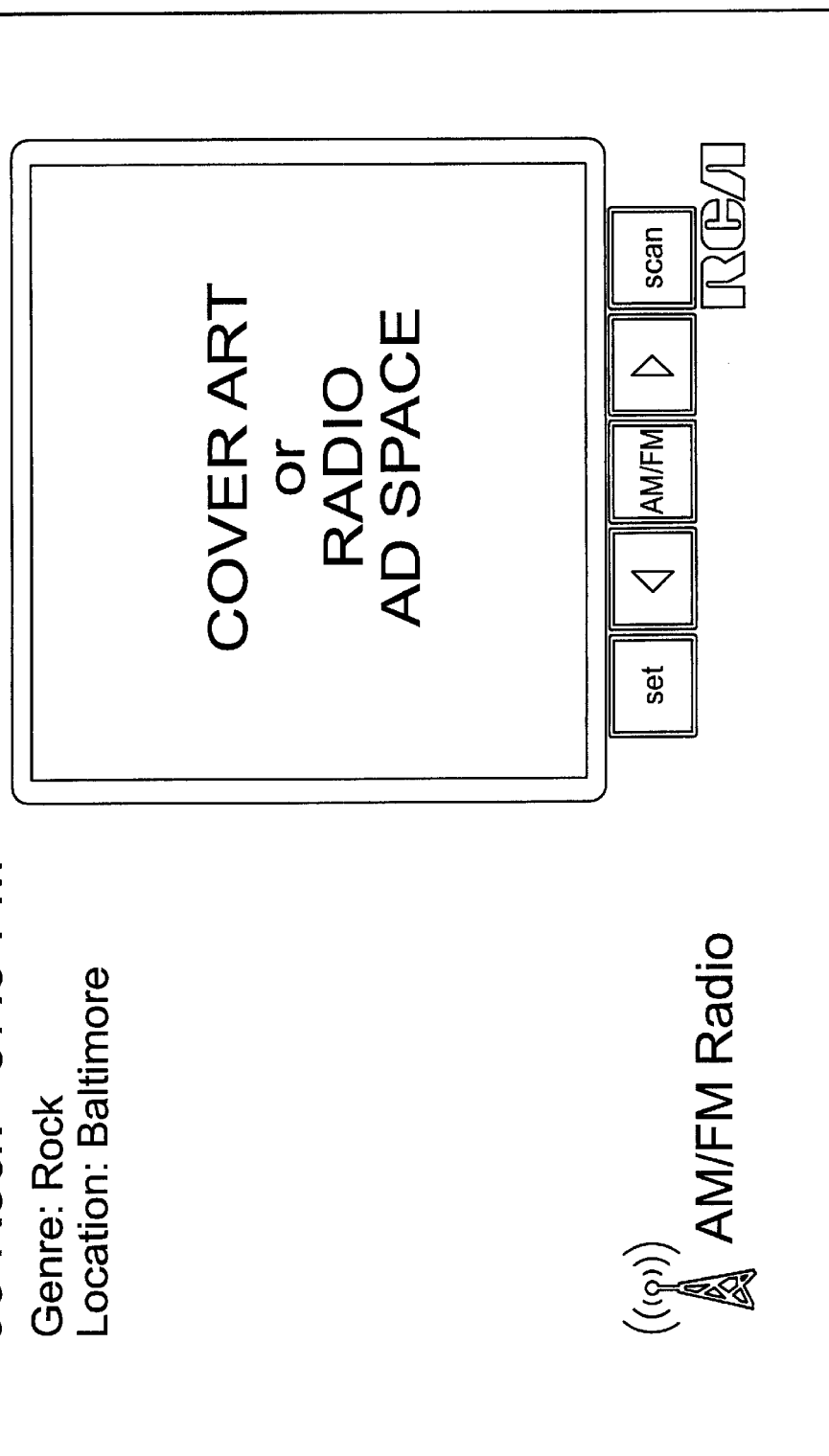
Figure 9:

During operation, the signal information for the presets may be displayed as illustrated in FIG. 5 where the labels for different subsets appear near the top as "All Stations," "Local Rock," "The Best Net," "County," and "TV Kids," and is followed by medium selection data, i.e., "Band", and signal information, such as "Station," "Genre" and "Location." Once a station is selected, a display like that illustrated in FIG. 6 or FIG. 7 may be generated showing additional signal information, as well as other stations that may be selected. Alternatively, the other presets for a subset may be hidden to produce a display like that illustrated in FIG. 8 for a signal from a broadcast station or in FIG. 9 for an Internet station. As indicated in FIGS. 8 and 9, an area is preferably included in the display for a graphic image or advertisement, either embedded in the signal received from the signal source, or received from a separate computer network connection 38.

One of the benefits of integrating signals broadcast from antenna to antenna and routed via a packet-based network is that some of the signal sources may have redundant communication media. For example, preset 7 in FIG. 7 indicates that the band is AM radio. However, the signal information indicates that there is an Internet address for the station. Preferably, the software executing in CPU 26 identifies signal information for a signal source that can be obtained via a different communication medium whenever possible for the currently selected signal source. The condition of the signal selected by the user is monitored to determined 126 if there is deterioration beyond a predetermined threshold caused by interference in a broadcast radio signal or net congestion when receiving the signal via the Internet. If signal deterioration is detected 126, CPU 26 switches 128 to an alternate medium for the same signal source. Monitoring continues and if the originally selected medium begins supplying a strong signal, system 20 switches back.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of identifying signal sources, comprising:
   selecting a communication medium from a plurality of communication media, to supply a signal;
   storing medium selection data identifying the communication medium;
   obtaining the signal from a signal source via the communication medium; and
   accessing at least one database from a data source separate from the signal source to obtain signal information about the signal source.

2. A method as recited in claims 1, wherein said selecting selects between at least broadcast signals received from an antenna and packetized signals received via a packet-based network.

3. A method as recited in claim 2, wherein the signal information includes at least one of call letters, genre and geographical location of the signal source.

4. A method as recited in claim 3, wherein said storing includes a signal frequency in the signal selection data when the medium selection data indicates that the communication medium uses broadcast signals and includes a network address when the medium selection data indicates that the communication medium uses the packet-based network.

5. A method as recited in claim 3, further comprising displaying the signal information for receivable signals from multiple signal sources using any of the communication media.

6. A method as recited in claim 5,
   wherein the genre and a source identifier is included in the signal information for at least some of the signal sources, and
   wherein said displaying lists the signal information sorted by the genre.

7. A method as recited in claim 5, further comprising automatically organizing the signal information for the signal sources that has been stored for display into a plurality of subsets with at least one common characteristic in each subset.

8. A method as recited in claim 7, further comprising reporting a selected subset specified by the user to a remote system via the packet-based network.

9. A method as recited in claim 8, further comprising receiving information directed to the user based on the signal information in one of the subsets.

10. A method as recited in claim 9, wherein said receiving is further based on a geographical location of the user.

11. A method as recited in claim 7,
    wherein said storing includes the genre and a source identifier in the signal information for the signal sources and at least one of the subsets is organized based on the genre,
    wherein said method further comprises identifying at least one preferred genre selected by the user from a first group of sources included in the at least one of the subsets; and
    wherein said obtaining includes accessing the database to obtain the signal information for a second group of sources having the at least one preferred genre.

12. A method as recited in claim 11, wherein the first group of sources provide the broadcast signals received from an antenna and the second group of sources provide the packetized signals received via the packet-based network.

13. A method as recited in claim 5, further comprising receiving information directed to the user based on a currently selected source for playback.

14. A method of identifying signal sources, comprising:
    selecting a communication medium from a plurality of communication media, including at least broadcast signals received from an antenna and packetized signals received via a packet-based network, to supply a signal;
    storing medium selection data identifying the communication medium, including first and second medium selection data for receiving the signal from the signal source via first and second communication media, respectively;
    obtaining the signal from a signal source via the communication medium;
    accessing at least one database from a data source separate from the signal source to obtain signal information about the signal source;
    outputting the signal from the signal source as received via the first communication medium in response to selection by a user; and
    automatically switching to the second communication medium for receipt of the signal in response to detection of deterioration of the signal.

15. A method of identifying signal sources, comprising:
    obtaining a signal from a signal source via a communication medium that uses broadcast signals;
    accessing at least a zip code database of zip codes, latitude and longitude and a station database including broadcast station frequencies and broadcast station locations stored as longitude and latitude, from at least one data source separate from the signal source;
    determining a frequency and a receiving location of the signal based on longitude and latitude for the zip code of the receiving location, and
    calculating a most likely station broadcasting the signal based on the frequency, the receiving location of the signal, the broadcast station frequencies and the broadcast station locations by multiplying degrees latitude by 104/145 to obtain miles and obtaining degrees longitude corresponding to 100 miles at a latitude of x using the following formula $$|(1.6093/(111*\cos(x))*100)|.$$

16. At least one computer program stored on a computer-readable medium, embodying a method comprising:
    selecting a communication medium from a plurality of communication media;
    obtaining a signal from a signal source via the communication medium;
    accessing at least one database from a data source separate from the signal source to obtain signal information about the signal source; and
    storing the signal information and signal selection data defining how the signal is obtained via the communication medium and medium selection data identifying the communication medium.

17. At least one computer program as recited in claim 16, wherein said selecting selects between at least broadcast signals received from an antenna and packetized signals received via a packet-based network.

18. At least one computer program as recited in claim 17, wherein the signal information includes call letters, genre and geographical location of the signal source.

19. At least one computer program as recited in claim 18, wherein said storing includes a signal frequency in the signal selection data when the medium selection data indicates that the communication medium uses broadcast signals and includes a network address when the medium selection data indicates that the communication medium uses the packet-based network.

20. At least one computer program as recited in claim 18, wherein said method further comprises displaying the signal information for receivable signals from multiple signal sources using any of the communication media.

21. At least one computer program as recited in claim 20,
wherein said storing includes the genre and a source identifier in the signal information for the signal sources, and
wherein said displaying lists the signal information sorted by the genre.

22. At least one computer program as recited in claim 20, wherein said method further comprises automatically organizing the signal information for the signal sources that has been stored for display into a plurality of subsets with at least one common characteristic in each subset.

23. At least one computer program as recited in claim 22, wherein said method further comprises reporting a selected subset specified by the user to a remote system via the packet-based network.

24. At least one computer program as recited in claim 23, wherein said method further comprises receiving information directed to the user based on the signal information in one of the subsets.

25. At least one computer program as recited in claim 24, wherein said receiving is further based on a geographical location of the user.

26. At least one computer program as recited in claim 22, wherein said method further comprises receiving information directed to the user based on a currently selected source for playback.

27. At least one computer program as recited in claim 22,
wherein said storing includes the genre and a source identifier in the signal information for the signal sources and at least one of the subsets is organized based on the genre,
wherein said method further comprises identifying at least one preferred genre selected by the user from a first group of sources included in the at least one of the subsets; and
wherein said obtaining includes accessing the database to obtain the signal information for a second group of sources having the at least one preferred genre.

28. At least one computer program as recited in claim 27, wherein the first group of sources provide the broadcast signals received from an antenna and the second group of sources provide the packetized signals received via the packet-based network.

29. At least one computer program as recited in claim 17,
wherein said storing includes first and second medium selection data for receiving the signal from the signal source via first and second communication media, and
wherein said method further comprises:
outputting the signal from the signal source as received via the first communication medium in response to selection by a user, and
automatically switching to the second communication medium for receipt of the signal in response to detection of deterioration of the signal.

30. At least one computer program stored on a computer-readable medium, embodying a method comprising:
obtaining a signal from a signal source via a communication medium;
accessing at least one database, including zip codes, latitude and longitude, from a data source separate from the signal source to obtain signal information about the signal source, with broadcast station locations stored as longitude and latitude;
determining a frequency and a receiving location of the signal based on longitude and latitude for the zip code of the receiving location; and
calculating a most likely station broadcasting the signal based on the frequency, the receiving location of the signal, and the broadcast station frequencies and locations, by multiplying degrees latitude by 104/145 to obtain miles and obtaining degrees longitude corresponding to 100 miles at a latitude of x using the following formula $$|(1.6093/(111*\cos(x))*100)|.$$

31. An apparatus for identifying signal sources using at least one database provided by a data source, comprising:
a network connection to at least one packet-based network providing packetized signals;
a tuner to receive a signal from a signal source separate from the data source;
a processor, coupled to the at least one database and said tuner, to obtain signal information about the signal source from the at least one database; and
a storage unit to store signal information, a signal frequency of the signal and medium selection data indicating whether the signal is one of a broadcast signal received from the tuner or one of the packetized signals.

32. An apparatus as recited in claim 31, wherein said storage unit further stores call letters, genre and geographical location.

33. An apparatus as recited in claim 31, wherein said storage unit further stores a signal frequency when the medium selection data indicates that the communication medium uses broadcast signals and includes a network address when the medium selection data indicates that the communication medium uses the packet-based network.

34. An apparatus as recited in claim 31, further comprising a display, coupled to said processor, to display the signal information for receivable signals from multiple signal sources using any of the communication media.

35. An apparatus as recited in claim 34,
wherein said storage unit stores genre information and a source identifier for the signal sources, and
wherein said display lists the signal information sorted by the genre.

36. An apparatus as recited in claim 34, further comprising an input port, coupled to said processor, to receive control signals from a user specifying a subset of the signal information stored for display by said storage unit.

37. An apparatus as recited in claim 36, wherein said network connection further outputs the subset specified by the user to a remote system via the packet-based network.

38. An apparatus as recited in claim 36,
wherein said storage unit stores genre information and a source identifier in the signal information for the signal sources, and wherein said processor identifies at least one preferred genre from a first group of sources selected by the user for inclusion in the subset, based on the genre information, and accesses the at least one database to obtain the signal information for a second group of sources having the at least one preferred genre.

39. An apparatus as recited in claim 38, wherein the first group of sources provide broadcast signals received from said tuner and the second group of sources provide the packetized signals received via the packet-based network.

40. An apparatus as recited in claim 36, wherein said processor selects between at least broadcast signals received from said tuner and packetized signals received via a said network connection.

41. An apparatus for identifying signal sources using at least one database provided by a data source, comprising:

a network connection to at least one packet-based network providing packetized signals;

a tuner to receive a signal from a signal source separate from the data source;

a storage unit to store signal information, a signal frequency of the signal and first and second medium selection data for the signal to be received from the signal source via said tuner and said network connection, respectively; and a processor, coupled to the at least one database, said tuner and said storage unit, to obtain signal information about the signal source from the at least one database, to automatically switch between said tuner and said network connection to obtain the signal from the second communication medium in response to detection of deterioration of the signal.

42. An apparatus for identifying signal sources using data provided by a data source storing a station database storing broadcast station frequencies and broadcast station locations as longitude and latitude and a database of zip codes, latitude and longitude, said apparatus comprising:

a tuner to receive a signal from a signal source separate from the data source; and a processor, coupled to the at least one database and said tuner, to obtain signal information about the signal source from the at least one database, to determine a frequency and a receiving location based on the longitude and the latitude for the zip code of the receiving location, to convert latitude to miles by multiplying by 104/145 and to obtain degrees longitude corresponding to 100 miles at a latitude of x using the following formula $$|(1.6093/(111*\cos(x))*100)|.$$

43. An apparatus for identifying signal sources, comprising:

means for selecting a communication medium from a plurality of communication media, to supply a signal;

means for storing medium selection data identifying the communication medium;

means for obtaining the signal from a signal source via the communication medium; and means for accessing at least one database from a data source separate from the signal source to obtain signal information about the signal source.

44. An apparatus for identifying signal sources, comprising:

means for selecting a communication medium from a plurality of communication media, including at least broadcast signals received from an antenna and packetized signals received via a packet-based network, to supply a signal;

means for storing medium selection data identifying the communication medium, including first and second medium selection data for receiving the signal from the signal source via first and second communication media, respectively;

means for obtaining the signal from a signal source via the communication medium;

means for accessing at least one database from a data source separate from the signal source to obtain signal information about the signal source;

means for outputting the signal from the signal source as received via the first communication medium in response to selection by a user; and means for automatically switching to the second communication medium for receipt of the signal in response to detection of deterioration of the signal.

* * * * *